US006983439B1

(12) United States Patent
Saunders et al.

(10) Patent No.: US 6,983,439 B1
(45) Date of Patent: Jan. 3, 2006

(54) UNIFIED PLACER INFRASTRUCTURE

(75) Inventors: James L. Saunders, Mountain View, CA (US); Krishnan Anandh, San Jose, CA (US); Guenter Stenz, Campbell, CA (US); Sudip K. Nag, San Jose, CA (US); Jason H. Anderson, Toronto (CA)

(73) Assignee: Xilinx, Inc., San Jose, CA (US)

( * ) Notice: Subject to any disclaimer, the term of this patent is extended or adjusted under 35 U.S.C. 154(b) by 319 days.

(21) Appl. No.: 10/283,638

(22) Filed: Oct. 29, 2002

Related U.S. Application Data

(60) Provisional application No. 60/403,550, filed on Aug. 13, 2002.

(51) Int. Cl.
*G06F 9/45* (2006.01)

(52) U.S. Cl. .............................................. 716/9; 716/3

(58) Field of Classification Search ................ 716/2–3, 716/7–10

See application file for complete search history.

(56) References Cited

U.S. PATENT DOCUMENTS

| | | | | |
|---|---|---|---|---|
| 6,631,508 | B1 * | 10/2003 | Williams | 716/8 |
| 6,704,915 | B1 * | 3/2004 | Andreev et al. | 716/9 |
| 6,721,935 | B2 * | 4/2004 | Morinaga | 716/11 |

* cited by examiner

*Primary Examiner*—Stacy A. Whitmore
(74) *Attorney, Agent, or Firm*—W. Eric Webostad; Robert Brush; Justin Liu

(57) ABSTRACT

Method and apparatus are described for a placer system for placing design objects onto an arrayed architecture, such as a programmable logic device including an FPGA. More particularly, a placer interface is described for communicating with a placer core. The placer interface receives information from external entities, and unifies and generalizes this information for the placer core. The external entities comprise different representations of architecture, design, device, constraints and algorithm-dictated placer-movable objects.

8 Claims, 6 Drawing Sheets

UNIFIED PLACER INFRASTRUCTURE

FIELD OF THE INVENTION

One or more aspects of the invention generally relate to a placer infrastructure for placing a design onto an arrayed architecture, and more particularly to a unified placer infrastructure for placing a design on a programmable logic device.

BACKGROUND OF THE INVENTION

Conventional modern integrated circuits are designed using programmed computers. Such computers are conventionally programmed with Electronic Design Automation (EDA) and Electronic Computer-Aided Design (ECAD) tools. These tools are used to provide both logical and physical synthesis. EDA tools take an abstract representation of a circuit design and transform such a circuit design into an arrangement of logic structures or other structures connected to one another as described by a network list or "netlist."

A synthesis tool having an understanding of logic and its constraints is given a netlist. As a result, a synthesis tool can direct a placer of a place-and-route tool to keep closely linked logic structures together.

Unfortunately, placer tools are less flexible than needed. During a design process, one or more aspects may change, and conventional placer tools do not allow for sufficient variability without significant re-coding. For example, it would be desirable if a placer tool could more readily accommodate:

- One or more different architectures, including, but not limited to, new kinds of entities, such as microprocessors, block memories, flip-flops, lookup-tables, among other known logic structures, including one or more different arrangements thereof;
- One or more different representations for designs and devices;
- One or more different algorithm-dictated structure requirements, including ability to operate at various levels of abstraction, for example, placement of a group of components that share output as a placer-movable object, and then treating individual components of such a group as placer-movable objects for finer grain improvement;
- One or more different physical constraint representations, including constraining circuit placement to a particular area of an integrated circuit device or to specific positions in such a device, or prohibiting placement of certain circuits in certain positions, as well as other list constraints and prohibit constraints.

Accordingly, it would be both desirable and useful to provide means for adding variability, whether with respect to one or more changes to one or more of architecture representation, design representation, algorithm-dictated abstraction or physical constraint representation, to a placer tool to reduce re-coding needed to accommodate such variability.

SUMMARY OF THE INVENTION

An aspect of the invention is a placer system. A placer core includes at least one placement algorithm. A placer interface is coupled to the placer core. The placer interface insulates the placer core from entities external to the placer core. The external entities comprise device or architecture representations, design and device representations, algorithm-dictated abstraction and constraint representations. Any and all such representations include representation changes or updates.

An aspect of the invention is a method for placement of integrated circuit components. A universal grid responsive to the architecture objects is generated, at least one packed grid is generated responsive to the universal grid and placer-movable objects. The universal and packed grids are the primary components of the placer interface. All external variations are captured in the grids in a generalized fashion, insulating the placer core.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE DRAWINGS

Figure 1:
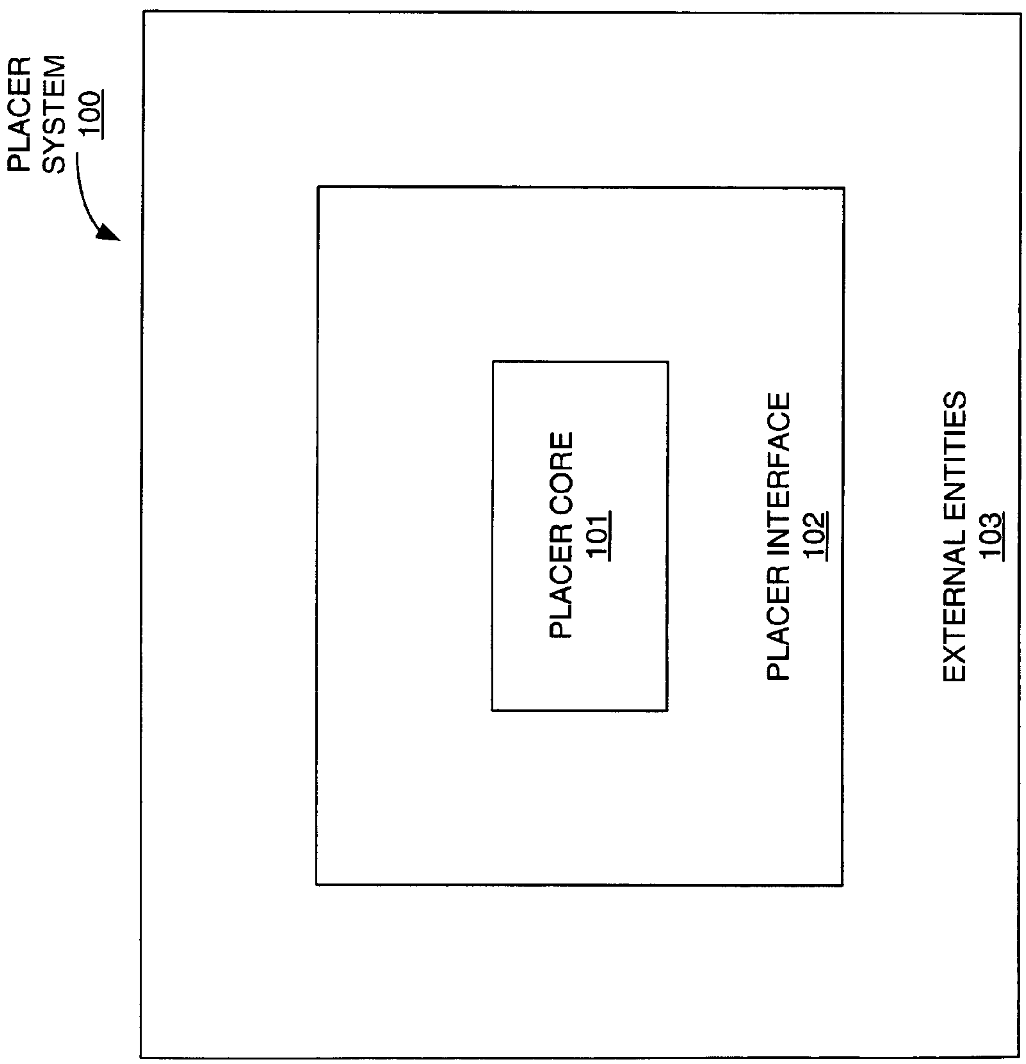
FIG. 1 is a block diagram of an exemplary embodiment of a placer system in accordance with one or more aspects of the invention.

In the following description, numerous specific details are set forth to provide a more thorough understanding of the invention. However, it will be apparent to one of skill in the art that the invention may be practiced without one or more of these specific details. In other instances, well-known features have not been described in order to avoid obscuring the invention.

One or more aspects of the invention relate to one or more placer-information-related structures. Though placer-information-related structures are described in terms of grids for simplicity, it should be appreciated that databases, spreadsheets, tables and like information-related structures may be used.

Each unique structure for placer-movable objects is associated with its own placer-information-related sub-structure or "packed grid." Again, though placer-information-related sub-structures are described in terms of grids for purposes of clarity, it should be appreciated that databases, spreadsheets, tables and like information-related structures may be used.

A placer-movable object may represent one or more design components that have a specified physical relationship implemented by specific architectural features, and can be placed anywhere in a packed grid associated with such a placer-movable object subject to constraints. Notably, placer-movable objects may be groups of logic or discrete components. Accordingly, placer-movable objects may be thought of as black boxes, where one or more inputs and outputs are defined. The black box notion is with respect to software modeling; a black box signifies that the software tools do not know what is inside the box.

A placer-movable object can comprise multiple sub-components. The sub-components are smaller sized objects than a component object from which they are obtained. Both sub-component and component level abstractions of circuits may be modeled in software as black-boxes. Thus, it should be appreciated that there may be a range of levels of abstraction of circuits where one level may be at a higher or lower level than another level. At a lowest level of circuit abstraction is a most basic or fundamental component or sub-component model. For simplicity, distinction between components and sub-components is not always made, though it should be appreciated that reference to a component may include or be a lower level circuit abstraction.

A placer-movable object has a "reference component." When a placer-movable object comprises one component, then that component is the reference component. When a placer-movable object comprises multiple components, one of the components is called the reference component. All non-reference components have an offset defined by distance from the reference component, such as in X and Y coordinates of a "universal grid." A universal grid is a grid having one or more lowest level component software modeled black box circuits, and more particularly there may be designated or constrained locations for such black box circuits within such a universal grid.

Constraints can be assigned to components of a placer-movable object. These constraints are provided, at least in part, with respect to a "universal grid." A set of constraints on components of a placer-movable object in a universal grid is transformed to a "derived constraint" on the placer-movable object itself in association with its "packed grid." A "packed grid" is a grid derived from a universal grid based on all possible locations for a reference component of a placer-movable object within such a universal grid.

A set of constraints on each component in the "universal grid" is translated to what that constraint means in terms of the reference component of a placer-movable object to provide a derived constraint. The derived constraint on the reference component in the universal grid is translated to its equivalent location in the "packed grid," and such location in the "packed grid" is marked. This process is continued for all components of a placer-movable object. For every constrained component, the prior step results in a set of allowed points on a packed grid for the placer-movable object with respect to that constrained component. The final allowed locations for a placer-movable object are the intersections of all such sets of locations for all components of such a placer-movable object.

If the final allowed locations in the packed grid for placer-movable objects have specific shapes, they can be represented and processed relatively efficiently as compared with explicitly listing the locations. For example, suppose a final allowed location occupies an area, A, of M-by-N points for M and N equal to 10. Rather than representing and processing this area as one hundred points, area A can be efficiently represented with just two points, the bottom-left and top-right points of a rectangle, with the information that the shape is a rectangle. Thus, in this example two and not 100 point locations would be processed. Thus, for clarity, rather than describing covering an area with points, rectangles, boxes or blocks are used to describe covering an area, such as in a packed grid. The final resolved locations on a placer-movable object's packed grid are covered, for example, with the minimum number of rectangles needed, such that all blocks in each rectangle are marked. The resultant set of rectangles represents a derived constraint of a placer-movable object in such a packed grid.

FIG. 1 is a block diagram of an exemplary embodiment of a placer system 100 in accordance with one or more aspects of the invention. Placer system 100 comprises placer core 101 coupled to external entities via placer interface 100.

Placer system 100 comprises one or more conventional placer tool algorithms. Placer interface 102 insulates core placer 101 from external entities 103, namely, from one or more of architecture representations, design representations, device representations, physical constraint representations, or structure requirements. Notably, algorithm requirements for structures may be obtained from requirements of a placer core algorithm 111 (shown in FIG. 2.). However, once such algorithm requirements are obtained, they may be stored and accessed externally with respect to placer core 101. Thus, algorithm requirements may be used for one or more different structure requirements, for example, ability to operate at various levels of abstraction, such as placement of a group of components that share output as a placer-movable object and then treating individual components of such a group as placer-movable objects for finer or less granular improvement.

Accordingly, it should be appreciated that placer system 100 can accommodate changes to representations of architecture, constraints, device, or design or any combination of these. Thus, subsequent generation representations may be accommodated without having to revise one or more placer core algorithms. Furthermore, placer system 100 is platform independent with respect to external entities such as representations of architecture, constraint, device, or design or any combination of these.

Placer interface 102 is capable of representing all placer related entities in a generalized fashion. The generalized representation comprises a universal grid (a collection of fundamental black boxes for an architecture), a set of placer-movable objects with a structure defined by black boxes, a set of packed grids generated in response to every unique placer-movable object structure, and constraints for placer-movable objects migrated to their respective packed grids.

Other advantages that may be achieved by placer system 100 include reductions in placer code, one implementation for one algorithm, efficient handling of new architectures, objects identically coded or processed at the core, increased scope of compatibility between placer and constraints, plug-play capability for algorithms, improved code-coverage, simplified testing, and common error messaging across architectures.

Figure 2:
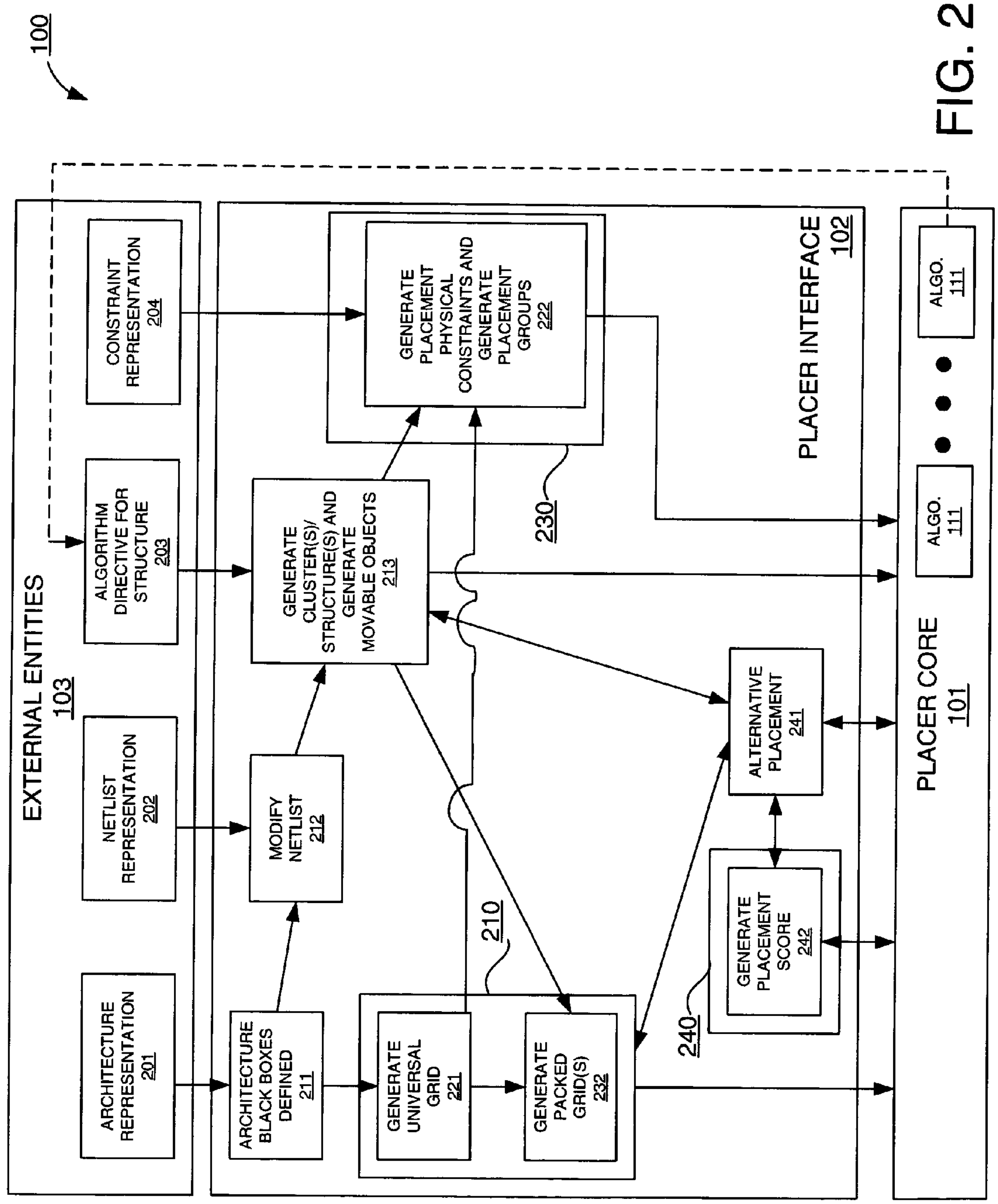
FIG. 2 is a block diagram of exemplary data flows via placer system of FIG. 1 in accordance with one or more aspects of the invention.

FIG. 2 is a block diagram of exemplary data flows via placer system 100 in accordance with one or more aspects of the invention. Within external entities 103, at 201, one or more architecture definitions or representations are obtained. An architecture definition conventionally is a listing of elements, which may include a layout of such elements.

A programmable logic device (PLD) is a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, an FPGA, is popular because of a superior combination of capacity, flexibility, time-to-market, and cost. An FPGA typically includes an array of CLBs and a number of programmable IOBs. The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA. For purposes of clarity, an example of an FPGA will be used, though it will be apparent that any architecture may be used that can be characterized as a layout of "a black box" or "black boxes" having one or more inputs and one or more outputs, which may or may not be related. The representation of the layout of an architecture in terms of architecture black boxes, is referred to as an architecture or device representation.

Within external entities 103, at 202, one or more design representations are obtained. Conventionally generated from a database or library of available circuit components or objects, a design is conventionally represented as a network or netlist of objects that can be treated like design black boxes.

Within external entities 103, at 203, one or more algorithm requirements are obtained and stored. Such algorithms refer to one or more levels of abstraction. Different algorithm requirements can work at different levels of abstraction, including object clusters and individual objects.

Within external entities 103, at 204 one or more physical constraints are obtained. Examples of constraints include timing constraints and constraints on object locations, among other constraints. Constraints provided are at the level of fundamental architecture black boxes, and are independent of algorithmic abstractions.

A new architecture, a new device, a new design, or a new constraint, or a combination thereof, may be supplied without having to change placer core 101 algorithm implementations. Placer interface 102 therefore provides a placer infrastructure where external entities 103 are abstracted and provided to the placer core 101 in a unified and generalized manner. Notably, though in FIG. 2 external entities provide for variations in at least one of each of an architecture representation, a design representation, an algorithm dictated structure creation, and a constraint representation, one or more of these variations may be omitted depending on implementation.

At 211, one or more architecture black boxes are defined in response to an architecture representation obtained at 201. At 221, architecture representation in terms of architecture black boxes or objects is used to generate a universal grid.

At 212, design netlist(s) obtained at 202 are modified in response to architecture black boxes from 211 to provide a modified netlist. In other words, a design netlist representation is converted to a netlist of objects that can be placed in architecture black box locations.

At 203, algorithm-dictated guidelines are provided for creating placer-movable objects. Information from 203 and 212 is used in 213 to create a netlist of placer-movable objects or P1_Groups. Making this netlist of placer-movable objects is referred to as P1_Design. Every P1_Group has an associated structure called P1_GroupType. A P1_GroupType structure is defined in terms of architecture black box entities.

At 232, P1_Groups from 213 are used to generate at least one packed grid. A packed grid is created for every unique P1_Group structure or every unique P1_GroupType. Such packed grids (P1_PackedGrid) and a universal grid (P1_UniversalGrid) provide a generalized device representation that is referred to as P1_Device 210. Multiple P1_GroupTypes can, in some cases, refer to the same P1_PackedGrid, e.g. for homogeneous structures of different sizes.

P1_Groups are placer-movable objects. Different algorithms in placer core 101 can operate at different levels of abstraction. Hence, different algorithms can operate on a different set of P1_Groups, each set covering a whole netlist without redundancy. Thus, the set of P1_Groups that an algorithm operates on, also known as the active P1_Groups set, is a disjoint set. In other words, no two active P1_Groups comprise the same design element.

At 222, a placement constraint entity (P1_Constraint) 230 generates placement physical constraints from that which is available from: constraint representations obtained at 204; modified netlists from 212,213; structures from 213, whether single or relationally placed macros (RPMs); and a universal grid from 221. Such physical constraints are used to generate an association of physical constraints to design black boxes and clusters thereof, as well as constraints with respect to grid-based locations.

At 222, P1_Constraint 230 generates P1_Group constraints in response to placement physical constraints received from 204. A placement constraint for a P1_Group may be created at or about the same time the P1_Group is created.

Component and grid-site-based constraints are transformed into P1_Group and P1_PackedGrid domains, respectively. This transformation includes transforming a P1_Group's allowed sites to its associated P1_PackedGrid. Marked objects in such a P1_PackedGrid are covered using polygons, such as quadrilaterals. By using a minimum number of such polygons, an envelope of such polygons may be used to set a static-window member of a P1_Group. Placement algorithms may impose physical constraints on design or device components to enhance quality of placement or to target design rule constraints imposed by a device architecture. Algorithm-specified physical constraints, or other algorithm constraints, may be incorporated into constraint processing. Algorithm constraints may be applied to one or more P1_Groups.

An intersection of specified design constraints for a specific design component with algorithm constraints on such a specified component may be performed to produce a "resultant constraint" acting on such a specified component. Unless an algorithm constraint overrides a default value, the algorithm constraint for each design component may have a default value of the whole of a target device made up of each said design component.

A resultant constraint on each component of a P1_Group may be shifted by a component's offset from a reference component for such a P1_Group. A shifted resultant constraint on all components of a P1_Group is intersected to produce a resultant constraint for such a P1_Group. A resultant constraint for a P1_Group may then be mapped to a minimum number of polygons on a P1_PackedGrid associated with the P1_Group.

Thus, a placement constraint comprises a set of polygons or windows for an associated P1_PackedGrid on which such polygons or windows indicate allowed locations for a P1_Group. To reduce memory usage, P1_Groups may share a P1_PacketGrid provided they have the same placement constraints, namely, the same set of polygons or placement constrained objects.

Placer core 101 receives P1_Group constraints, P1_PackedGrids, and a P1_UniversalGrid. Placer core 101 uses this information to generate a placement, namely, to place P1_Groups on P1_PackedGrids and on a P1_UniversalGrid. This placement may be subsequently scored by placement scoring entity (P1_Score) 240. A score for a placement generated at 242 may be provided back to placer core 101 for refining a placement, or an alternative placement may be made at 241. Information to and from alternative placement 241 and P1_Device 210 and P1_Design from 213 may be used to generate an alternative placement, and such an alternative placement may be provided to placer core 101 directly, or to P1_Score 240 for scoring, and then to placer core 101 or back to alternative placement 241.

Figure 3B:
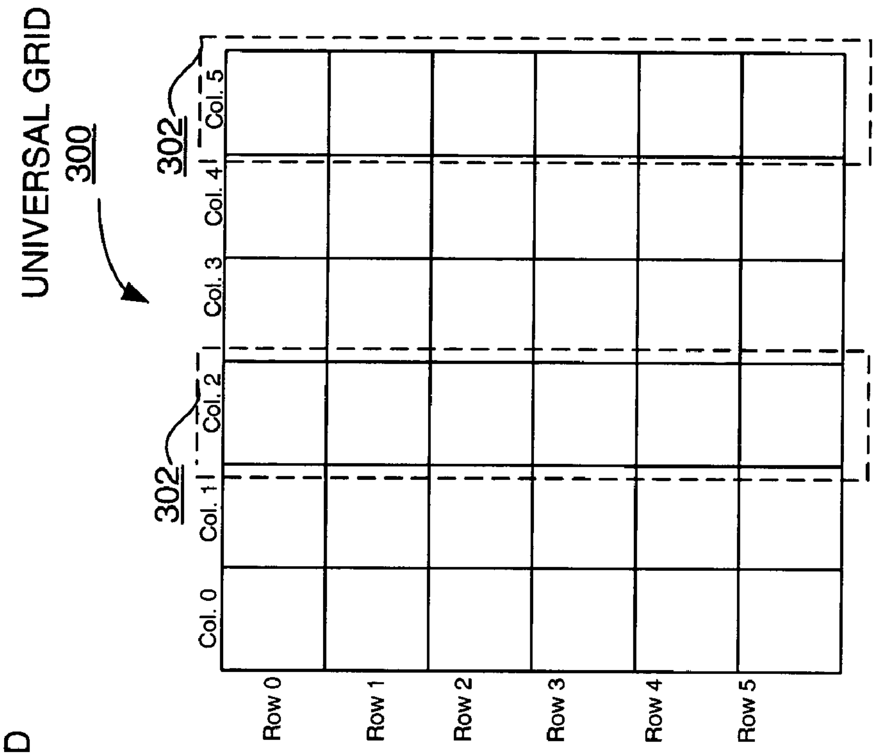
FIGS. 3A through 3D are grid diagrams of exemplary embodiments of grids in accordance with one or more aspects of the present invention.
Figure 3A:
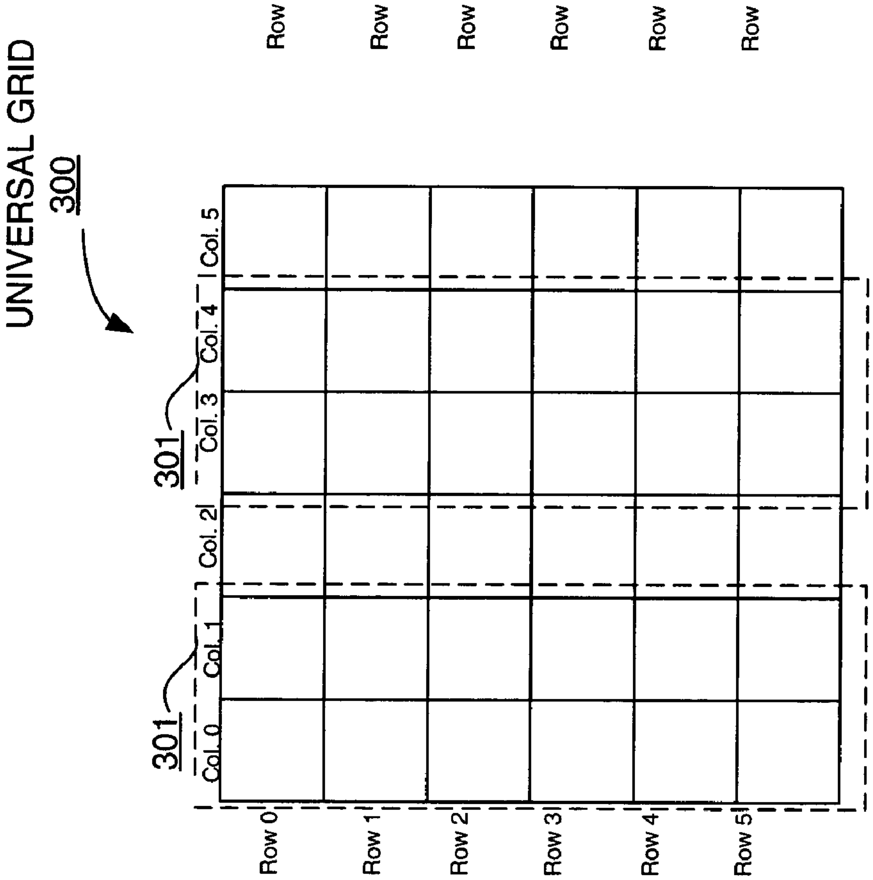
Figure 3C:
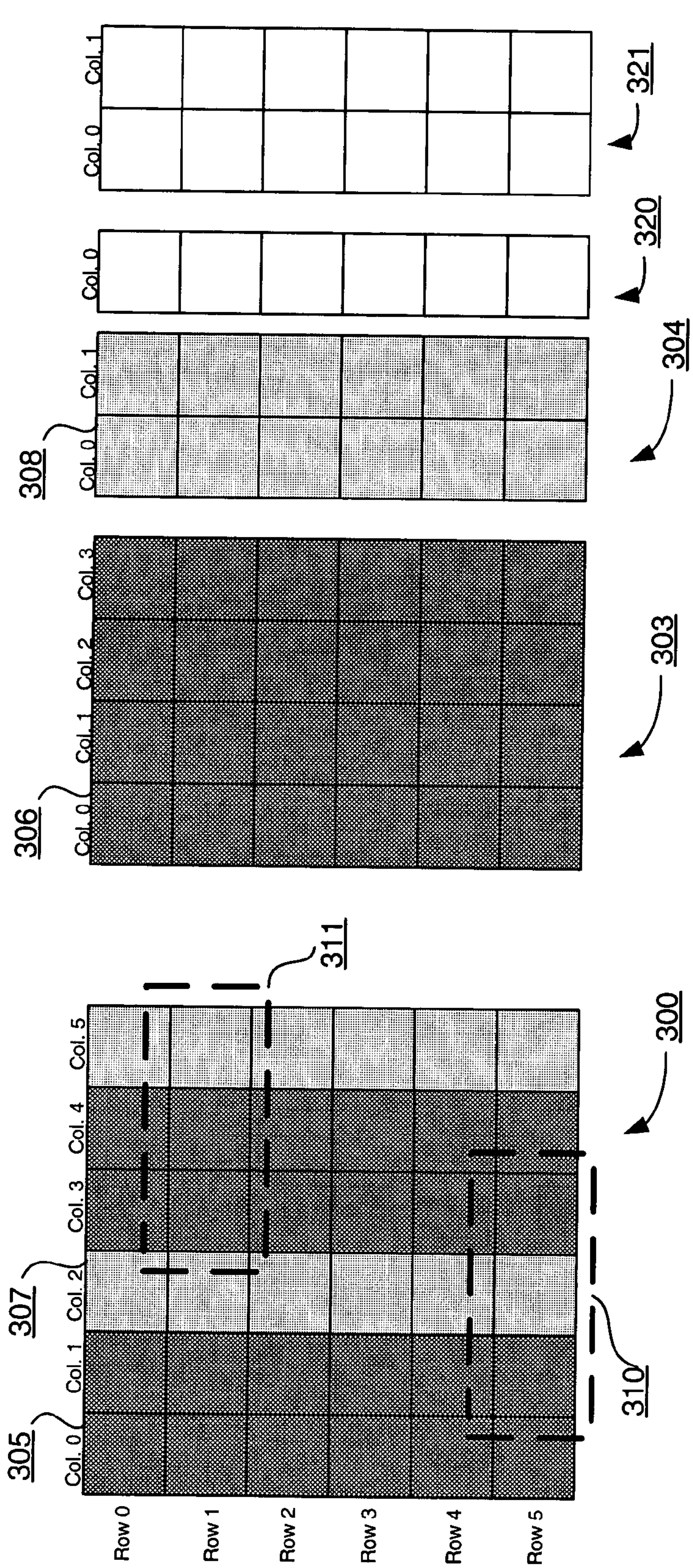
Figure 3D:
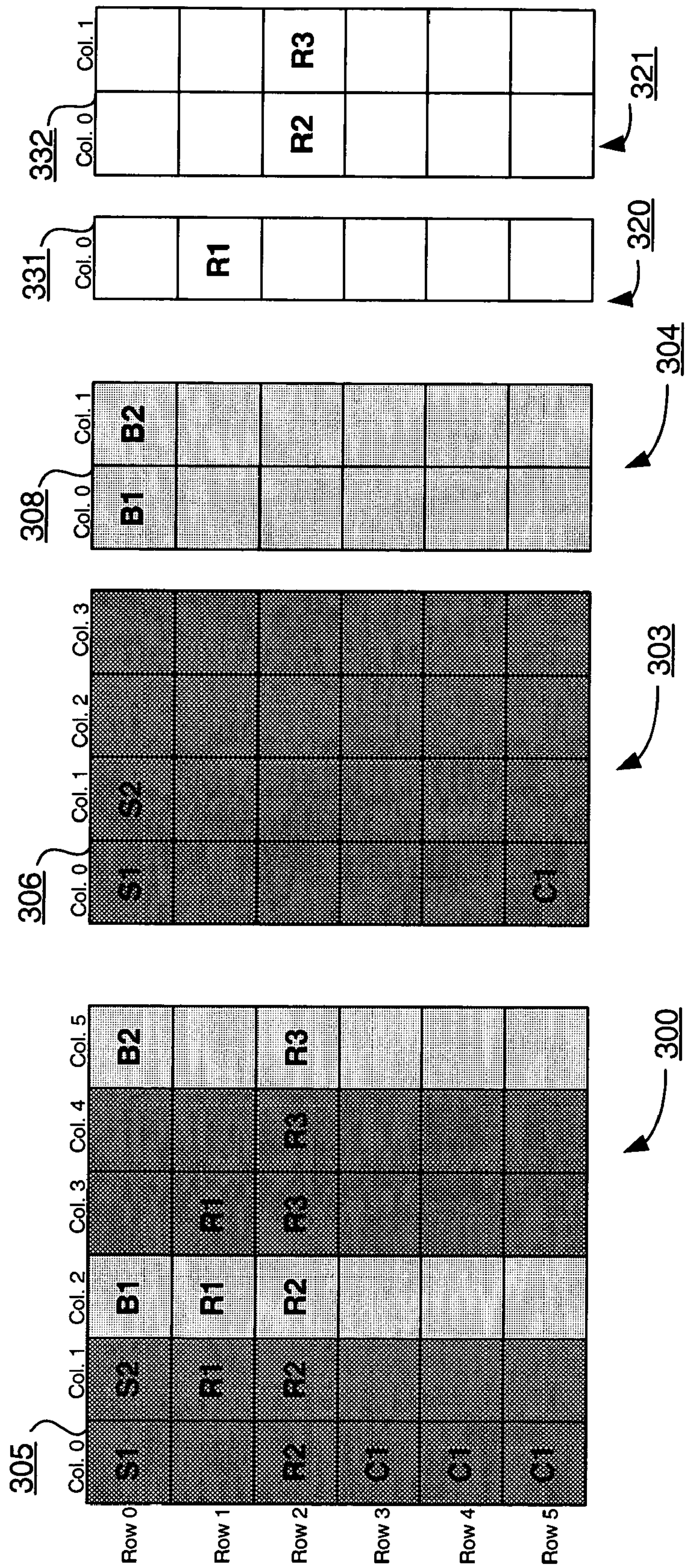

To further clarify details related to placement groups, group types and grids, such as may be used in placer system 100, a placer core 101's "view" of grids is provided in FIGS. 3A through 3D, which show exemplary grid diagrams in accordance with one or more aspects of the present invention. Grid 300 of FIGS. 3A and 3B is an example of a universal grid.

Continuing the above example of an FPGA, suppose the following design objects are provided: SLICE objects S1 and S2 of type 301; and BRAM objects B1 and B2 of type 302. Then universal grid 300 may be represented as in FIG. 3C, where dark shaded boxes represent SLICE object placement regions and lighter shaded regions represent BRAM object placement regions. In other words, placement of placer-movable objects in a universal grid is constrained to specified regions.

Additionally, packed grids 303 and 304 may be generated. Packed grid 303 is for a SLICE type or type 301, and packed grid 304 is for a BRAM type or type 302. Notably, in addition to type, packed grids 303 and 304 are related to universal grid 300 by number of possible sites. Thus, location 305 in universal grid 300 is tied to location 306 in packed grid 303. In other words, with respect to a type, a universal grid and packed grid for a design object have the same number and relative location of sites. So, universal grid 300 has six rows and four columns of SLICE type, as SLICE type packed grid 303. Moreover, universal grid 300 has six rows and two columns of BRAM type, as BRAM type packed grid 304, where locations 307 and 308 are related to one another. This is done, as mentioned above, by mapping all possible locations for each placer-movable object's reference component within a universal grid.

Suppose additionally that RPM objects are provided. Continuing the above example, suppose the following RPM objects are provided: RPM object R1 of type 310 designated as contiguous SLICE-BRAM-SLICE blocks in a horizontal alignment; and RPM objects R2, R3 of type 311 designated as contiguous SLICE-SLICE-BRAM blocks in a horizontal alignment. Notably, other RPMs may be used. Such RPMs need not be limited to horizontal alignment of sites, or even contiguous association of sites. Thus, RPMs may define horizontal, vertical, diagonal, continguous, or non-contiguous structures, including combinations thereof. However, for clarity, only the two example RPM structures will be described here.

Due to site-type limited locations within universal grid 300, there are a limited number of valid locations for RPM objects R1, R2 and R3. For RPM R1, there are only six possible locations in universal grid 300, and for RPMs R2 and R3, there are only twelve possible locations in universal grid 300. Accordingly, packed grid 320 for RPM R1 of type 310 is one column and six rows as associated with those six possible locations in universal grid 300, and packed grid 321 for RPMs R2, R3 of type 311 is two columns and six rows as associated with those twelve possible locations in universal grid 300.

Currently, in the example, there are seven P1_Groups, namely, S1, S2, B1, B2, R1, R2, and R3, and there are five placement grids, or P1_Grids, namely, 300, 303, 304, 320, and 321. Suppose additionally in the example there is a "carry" object, C1, of vertical length 3, such as a carry chain, without any alignment and with a new group-type that uses slice type objects. Notably, a carry object may or may not need alignment depending on integrated circuit implementation. There is no additional packed grid or P1_Group for C1, but it does add another group type, which may be termed "Carry_3." Thus, in this example there are five group types, or P1_GroupTypes, namely, SLICE 301, BRAM 302, RPM 310, RPM 311, and Carry_3.

For purposes of clarity, boxes or site areas ("sites") 305, 306, 308, 331 and 332 shall be row 0, column 0 (R0C0) locations for each of their respective grids. As mentioned above, it is more efficient to deal with areas than with individual points. Continuing the example with reference to FIG. 3D, S1 and S2 are placed in slice-grid 303 at locations R0C0 and ROC1, respectively, where R0C0 refers to Row 0 Column 0, and ROC1 refers to Row 0 Column 1. These placements cause placement of S1 and S2 in universal grid 300 at associated locations, namely, R0C0, ROC1 in grid 300.

Objects B1 and B2 in packet grid 304 are placed at locations R0C0 and ROC1, respectively. These placements cause placements of B1 and B2 in universal grid 300 at associated locations ROC2 and ROC5, respectively.

Object R1 is placed in R1C0 of packed grid 320. Notably, location R0C0, though apparently available in packed grid 320, is not available due to prior occupation of either of objects S2 or B1 in universal grid 300. Placement of R1 in packed grid 320 at location R1C0 causes placement of a corresponding structure in universal grid 300 at any of three starting locations depending on a reference component. So, for example, if the middle component of an R1 object is the reference component, then placement of R1 at location R1C0 in packed grid 320 causes placement of an R1 object in universal grid 300 at R1C2. The other R1's in universal grid 300 are placed offset from a reference component. Offsets in this example are (0,−1) and (0,1) for respective R1's. In other words, the offsets in this example are none for the row and one column to the right for one R1 component and one column to the left for another R1 component.

Notably, for a multiple placer-movable object structure, possible locations for each placer-movable object of such a structure within a universal grid may first be determined to obtain respective sets of all possible locations for each of such placer-movable objects. An intersection of all such sets results in a set of all possible locations within a universal grid for a multiple placer-movable object structure.

Objects R2 and R3 are placed in packed grid 321 at respective locations R2C0 and R2C1. Using placement of a reference component of each of such objects in universal grid 300 with offset components from such a reference component results in placement of objects R2 and R3 in universal grid 300. In this example, placement of R2 and R3 in respective locations R2C0 and R2C1 results in placement of R2 components at sites R2C0 through R2C2 and placement of R3 components at sites R2C3 through R2C5. Notably, R2 and R3 are placed in the first feasible positions working from R0C0. In other words, prior placement of S1, S2, B1, B2, and R1 precludes placing R2 or R3 objects in any of rows 0 and 1 of universal grid 300.

C1 is placed in slice-grid 303 at R5C0. Its impact is tested and updated in universal grid 300. Based on such analysis, the first valid spot for C1 in universal grid 300 is R5C0–R3C0, where the reference component is the lowest component. Placer core 101 views this situation as C1 being placed at R5C0 in universal grid 300 with length 3.

Notably, all circuit elements, whether slices, heterogeneous RPMs, carry chains, etc., are treated similarly by placer core 101. More particularly, all circuit elements are treated similarly by placer core 101 at any stage. Thus, placer core 101 treats P1_Groups as disjointed sets, where each P1_Group is associated with a P1_PackedGrid based on its P1_GroupType. Placement operations occur in a P1_PackedGrid belonging to a P1_Group being placed. However, validity checks are done in a universal grid, where inter-grid relationships are resolved. This means there is little to no specific code for basic placement operations like supporting P1_Group moves.

Figure 4:
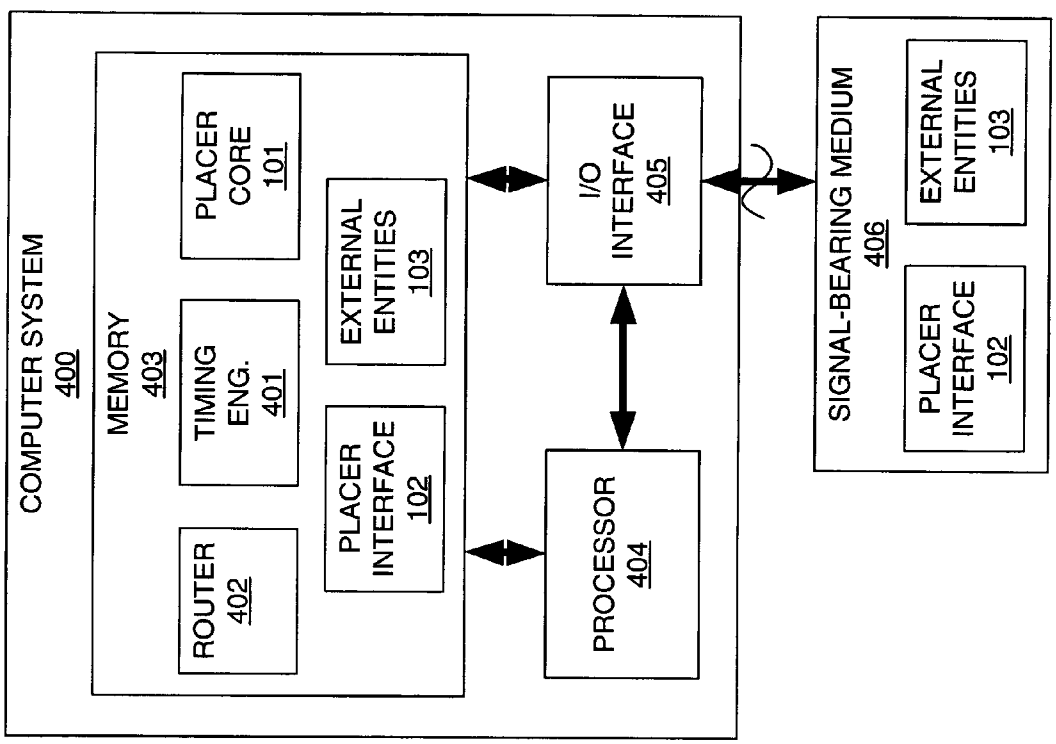
FIG. 4 is a block diagram of an exemplary embodiment of a programmed computer system in accordance with one or more aspects of the invention.

FIG. 4 is a block diagram of an exemplary embodiment of a programmed computer system 400 in accordance with one or more aspects of the invention. Computer system 400 comprises at least one processor 404 coupled to memory 403 and to I/O interface 405. Optionally, I/O interface 405 may be coupled to memory 403 for direct memory addressing. Memory 403 is shown programmed with all or a portion of a router 402, placer core 101, placer interface 102 and a timing engine 401. External entities 103 for carrying out at least a portion of one or more data flows, as described above, may be on signal-bearing medium 406 for communication with computer system 400. Moreover, all or a portion of placer interface 102 may be on signal-bearing medium 406, and all or a portion of external entities 103 may be in memory 403.

One or more aspects of the invention are implemented as one or more program products for use with a computer system such as, for example, computer system 400. The program(s) of the program product defines functions of the one or more aspects and can be contained on a variety of signal-bearing media, such as signal-bearing medium 406 and memory 403, which include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment includes information downloaded from the Internet and other networks. Such signal-bearing media, when carrying computer-readable instructions that direct the functions of the invention, represent one or more aspects of the invention.

While the foregoing is directed to embodiments of the invention, other and further embodiments of the invention may be devised without departing from the basic scope thereof, and the scope thereof is determined by the claims that follow. For example, one or more aspects of the invention were described in terms of an FPGA or FPGA architectures for purposes of clarity; however, FPGA architectures are merely one example, and other forms of architectures may be used in accordance with one or more aspects of the invention. Therefore, it is further understood that architectures other than FPGAs may be used. Examples of such other architectures include, but are not limited to, microprocessors, application specific integrated circuits, application specific standard products, digital signal processors, and the like.

What is claimed is:

1. A method for placement of objects representing circuits, comprising:

generating a universal grid;

generating placer-movable objects;

generating packed grids responsive to the placer-movable objects;

placing the placer-movable objects in the universal grid and the packed grids;

obtaining a first set of constraints in a domain of the universal grid; and translating the first set of constraints to a second set of constraints in a domain of the packed grids.

2. The method of claim 1, wherein each of the placer-movable components has a reference component, and wherein the second set of constraints is applied to the reference component of each of the placer-movable objects.

3. The method of claim 2, wherein the reference component is located in the universal grid.

4. The method of claim 3, wherein the reference component located in the universal grid has an associated location in a packed grid of the packed grids for a placer-movable object having the reference component.

5. The method of claim 4, further comprising:

marking the associated location; and covering the associated location marked.

6. A method for updating a placer system, comprising:

providing a placer core algorithm;

providing an interface between the placer core algorithm and external entities, wherein the interface translates representations of the external entities to generalized objects; and generating a placement with the placer core algorithm by generating a universal grid, generating backed grids responsive to the generalized objects, and placing the generalized objects in the universal grid and the packed grids;

wherein the interface is further configured to obtain a first set of constraints from the external entities in a domain of the universal grid, and wherein the step of generating the placement comprises:

translating the first set of constraints to a second set of constraints in a domain of the packed grids.

7. The method of claim 6, further comprising:

changing the external entities; and updating the interface responsive to changes of the external entities.

8. The method of claim 7, further comprising:

scoring the placement.

* * * * *